US011022219B2

(12) United States Patent
Hensel et al.

(10) Patent No.: US 11,022,219 B2
(45) Date of Patent: Jun. 1, 2021

(54) SEAL ELEMENT FOR CONNECTING A FIRST COMPONENT AND A SECOND COMPONENT IN A FLUID-TIGHT AND ELECTRICALLY CONDUCTIVE MANNER, AND CORRESPONDING COMPONENT ASSEMBLY

(71) Applicant: AUDI AG, Ingolstadt (DE)

(72) Inventors: Manfred Hensel, Wendelstein (DE); Roland Wegscheider, Mainburg (DE)

(73) Assignee: AUDI AG, Ingolstadt (DE)

( * ) Notice: Subject to any disclaimer, the term of this patent is extended or adjusted under 35 U.S.C. 154(b) by 147 days.

(21) Appl. No.: 16/319,920

(22) PCT Filed: Jun. 27, 2017

(86) PCT No.: PCT/EP2017/000752
§ 371 (c)(1),
(2) Date: Jan. 23, 2019

(87) PCT Pub. No.: WO2018/019400
PCT Pub. Date: Feb. 1, 2018

(65) Prior Publication Data
US 2019/0226582 A1 Jul. 25, 2019

(30) Foreign Application Priority Data
Jul. 25, 2016 (DE) ............ 10 2016 213 600.3

(51) Int. Cl.
*F16J 15/06* (2006.01)
*H05K 9/00* (2006.01)
*H01R 4/48* (2006.01)

(52) U.S. Cl.
CPC ............. *F16J 15/064* (2013.01); *H01R 4/48* (2013.01); *H05K 9/0018* (2013.01)

(58) Field of Classification Search
CPC ......... F16J 15/064; H01R 4/48; H05K 9/0018
See application file for complete search history.

(56) References Cited

U.S. PATENT DOCUMENTS 2,783,295 A * 2/1957 Ewing .................... H01P 1/042
174/367
2,966,539 A * 12/1960 Sears ...................... F16L 25/01
174/47

(Continued)

FOREIGN PATENT DOCUMENTS

CN 101155202 A 4/2008
CN 101375652 A 2/2009

(Continued)

OTHER PUBLICATIONS

Examination Report dated Aug. 5, 2018 in corresponding German Application No. 10 2016 213 600.3; 17 pages.

(Continued)

*Primary Examiner* — Eugene G Byrd
(74) *Attorney, Agent, or Firm* — Maier & Maier, PLLC

(57) ABSTRACT

A seal element for connecting a first component and a second component in a fluid-tight and electrically conductive manner. In this case, the seal element has an electrically conductive support element with a holding region and a main seal region which is angled relative to the holding region. The holding region has a first contact surface on one side for contacting the first component and a second contact surface on the other side for contacting the second component. At least one respective spring tongue which is formed integrally with the support element extends from the first contact surface and the second contact surface in the direction facing away from the respective other contact surface.

8 Claims, 3 Drawing Sheets

(56) References Cited

U.S. PATENT DOCUMENTS

| | | | | |
|---|---|---|---|---|
| 3,182,119 | A | * | 5/1965 | Millard ................. H02G 3/0616 174/151 |
| 3,182,120 | A | * | 5/1965 | Jens ..................... H02G 3/0616 174/151 |
| 3,509,907 | A | * | 5/1970 | Gannaway ............ F04B 39/125 137/512 |
| 4,061,413 | A | * | 12/1977 | Keller ...................... H01R 4/64 439/524 |
| 4,864,076 | A | * | 9/1989 | Stickney .............. H05K 9/0016 174/355 |
| 6,119,305 | A | * | 9/2000 | Loveall ..................... F16L 5/10 16/2.2 |
| 6,332,618 | B1 | * | 12/2001 | Karlsson .............. H05K 9/0016 174/17 CT |
| 6,768,058 | B2 | * | 7/2004 | Pallapothu .......... B60R 16/0222 16/2.1 |
| 7,438,596 | B2 | * | 10/2008 | Phillips .............. H01R 13/6582 439/607.01 |
| 8,430,365 | B2 | * | 4/2013 | Benoit .................... F16L 5/027 248/49 |
| 9,196,395 | B2 | * | 11/2015 | Kitano ..................... H01B 7/04 |
| 2008/0081679 | A1 | | 4/2008 | Kawasaki et al. |
| 2009/0181554 | A1 | * | 7/2009 | Chin ................... F16J 15/3236 439/13 |
| 2010/0203789 | A1 | | 8/2010 | Takebayashi et al. |
| 2010/0219185 | A1 | * | 9/2010 | Griffin .................. F16J 15/064 220/4.07 |
| 2013/0186684 | A1 | * | 7/2013 | Eyles ................... H01R 12/523 174/84 R |
| 2013/0199365 | A1 | | 8/2013 | Gaertner et al. |
| 2014/0367923 | A1 | | 12/2014 | Schaaf et al. |
| 2015/0024640 | A1 | * | 1/2015 | Yamada ............. H01R 13/2442 439/786 |

FOREIGN PATENT DOCUMENTS

| | | |
|---|---|---|
| CN | 102834613 A | 12/2012 |
| CN | 103477519 A | 12/2013 |
| CN | 104315150 A | 1/2015 |
| DE | 7437558 U | 3/1975 |
| DE | 3815517 A1 | 11/1989 |
| DE | 29920690 U1 | 3/2000 |
| DE | 4340108 C3 | 8/2003 |
| DE | 202004012578 U1 | 10/2004 |
| EP | 0340773 A2 | 11/1989 |
| GB | 2285448 A | 7/1995 |
| JP | 2006-69892 A | 10/2006 |

OTHER PUBLICATIONS

International Search Report and Written Opinion dated Sep. 27, 2017 in corresponding International Application No. PCT/EP2017/000752; 19 pages.

Office Action dated Nov. 21, 2019, in corresponding Chinese Application No. 201780046007.9; 10 pages.

Office Action dated Jun. 24, 2020 in corresponding Chinese Application No. 201780046007.9; 13 pages including English-language translation.

English Translation of International Preliminary Report on Patentability dated Feb. 7, 2019 in corresponding International Application No. PCT/EP2017/000752; 8 pages.

* cited by examiner

SEAL ELEMENT FOR CONNECTING A FIRST COMPONENT AND A SECOND COMPONENT IN A FLUID-TIGHT AND ELECTRICALLY CONDUCTIVE MANNER, AND CORRESPONDING COMPONENT ASSEMBLY

FIELD

The invention relates to a seal element for connecting a first component and a second component in a fluid-tight and electrically conductive manner. The invention further relates to a corresponding component assembly, comprising the first component, the second component and the seal element.

BACKGROUND

The seal element is arranged, for example during an assembly process, on both the first component and on the second component. In particular, after the assembly process, it lies between the first component and the second component, preferably being held by clamping between them. The seal element serves, on the one hand, for the fluid-tight connecting of the first component to the second component, or vice versa. This means that the seal element prevents the passage of fluid, especially of liquid, between the first component and the second component, and thus, in particular, the intrusion of the fluid or an emergence of the fluid.

The first component and the second component may basically have any desired configuration. For example, they are present as components of a housing, wherein the first component may be configured as the base body of the housing and the second component as a cover. Of course, it is also possible for the first component to be formed, for example, as a machine housing, and for the second component to be formed as a plug to be arranged on the machine housing. In the latter case, the first component is, for example, the machine housing of an electric machine, and the second component is part of a contact device for the electrical contacting of the electric machine, for example, for its power supply. In any case, however, the seal element shall be configured and arranged in such a way that the passage of fluid through it is prevented.

In addition, the seal element serves for the making of the electrically conductive connection between the first component and the second component. In this case, the first component and the second component are each at least electrically conductive in regions, so that an electrically conductive region of the first component can be connected electrically by way of the seal element to an electrically conductive second region of the second component, or is so connected after the assembly process. By making the electrically conductive connection between the two components, an EMC-proof connection is created (EMC: electromagnetic compatibility). This effectively prevents a passage, i.e., an entering or exiting of electromagnetic radiation through the seal element or between the first component and the second component.

Such seal elements often have a multi-piece design, so that, on the one hand, during fabrication and, on the other hand, during assembly a large labor expense and correspondingly high costs are incurred. In particular, an after-working of the seal elements is necessary during fabrication in order to ensure an adequate fluid tightness and an electrically conductive connection by means of the seal element. For this reason, the goal is to reduce the number of components.

For example, a shielding element is known from the publication Seal Element 43 40 108 C3 for increasing the electromagnetic compatibility of electrical or electronic functional groups, which are enclosed at least partly by electrically conductive shielding housing walls, or which contain circuit boards having electrically conductive shielding regions, wherein the shielding element is composed of a strip-shaped or frame-shaped rigid support element made of plastic, having at least one compressible or elastic layer made of conductive material disposed on one of its surfaces and being arranged for the tight conductive bridging between the regions of the circuit boards or housing walls being shielded.

SUMMARY

The object of the invention is to propose a seal element for the fluid-tight and electrically conductive connection of a first component and a second component, which has advantages over known seal elements; in particular, it can be produced and assembled with little expense.

This is achieved according to the invention with a seal element. In this case, it is provided that the seal element has an electrically conductive support element with a holding region and a main seal region that is angled relative to the holding region, wherein the holding region has a first contact surface on one side for contacting the first component and a second contact surface on the other side for contacting the second component, wherein at least one respective spring tongue which is formed in one piece with the support element extends, starting from the first contact surface and the second contact surface, in each case, in the direction facing away from the respective other contact surface, and wherein, on the main seal region, a first main seal part of an elastic seal sleeve on one side is applied by a first main seal surface against the first component to form the seal, and a second main seal part of the seal sleeve on the other side is applied by a second main seal surface against the second component to form the seal.

The seal element, accordingly, has two essential components, namely, the support element and the seal sleeve. The support element is composed of an electrically conducting or electrically conductive material and is preferably formed as a single piece. The material used may be metal, for example, especially steel, such as spring steel. The support element comprises the holding region and the main seal region, which are angled relative to each other. By this is meant that, in a sectional cut through the seal element, the holding region, for example, is defined by a first straight line or incorporates it, while the main seal region is defined by a second straight line or incorporates it.

The holding region and the main seal region or the two straight lines now subtend with each other an angle that is greater than 0° and less than 180°. In particular, the angle lies in the range of 45° to 135°, of 60° to 120°, of 70° to 110°, of 80° to 100° or it amounts to roughly or precisely 90°. The holding region and the main seal region are preferably a single piece and/or materially bonded, i.e., in the latter case, they are composed of the same material.

The holding region comprises the first contact surface on one side, and the second contact surface on the other side. The two contact surfaces preferably lie on opposite-lying sides of the holding region. Especially preferred, the two contact surfaces are arranged parallel to each other. For example, the holding region is web-shaped, whereby the two contact surfaces are joined together by way of a preferably continuous end face of the web, while the holding region transitions into the main seal region on its side opposite the end face.

It may be provided that the holding region and the main seal region meet each other at an abutment angle, especially the above described angle between the holding region and the main seal region. Alternatively, the transition between the holding region and the main seal region may be realized by a rounding or curve, in order to lessen the material stresses. The rounding is preferably associated with the main seal region.

The first contact surface of the holding region serves for the contacting of the first component; the second contact surface, in contrast, is provided for the contacting of the second component. At least one of the contact surfaces, preferably both of the contact surfaces, may lie for at least a portion against the respective component after the assembly of the seal element and the two components. However, it (they) may also be situated at a distance from the respective component, in particular parallel to a corresponding mating contact surface of the component.

For the electrical contacting of the first component and the second component by the seal element for the electrically conductive connection of the two components, the spring tongues are provided, each of the contact surfaces being associated with at least one of these spring tongues. Thus, one of the spring tongues extends from the first contact surface in the direction facing away from the second contact surface, thus, in particular, —after the assembly process—in the direction of the first component. The spring tongue associated with the second contact surface, on the other hand, extends from the second contact surface in the direction facing away from the first contact surface, thus, in particular, —after the assembly process—in the direction of the second component.

The spring tongues are configured and arranged such that, after the assembly of the seal element, they rest against the first component and the second component. Accordingly, after the assembly, the electrically conducting connection of the two components is assured by the spring tongues and the support element. The spring tongue or the spring tongues are formed as a single piece with the support element. Furthermore, they are preferably made by material bonding with the support element, i.e., they are also composed of the electrically conducting material of the support element.

During the assembly of the seal element or the two components, the spring tongues are deflected in resilient manner in the direction of the other respective contact surface, so that they are pushed by the spring force created in this way in the direction of the respective component or against it. In this way, a reliable electrically conducting connection is assured over the lifetime of the connection of the two components. Due to the resilient deflection of the spring tongues during the assembly process, they can furthermore produce a rubbing or abrasion against the respective component. In this way, a coating of the component, such as an oxide layer produced by oxidation, can be broken up and the electrical attachment of the spring tongue to the respective component can be improved. For example, the spring tongue for this purpose has an edge facing toward the respective component, especially a sharp edge, having for example a burr, preferably a stamping or punching burr.

The main seal region of the support element serves for holding the seal sleeve, which reaches around the main seal region and consequently the support element in regions. The seal sleeve comprises the first main seal surface and the second main seal surface. The first main seal surface faces toward the first component after the assembly and lies tightly against it. The same applies to the second main seal surface and the second component. The seal sleeve is preferably configured as a single piece, so that the two main seal surfaces are likewise configured as a single piece and preferably additionally materially bonded. For example, the seal sleeve is slipped over the main seal region of the support element, injection molded on it or against it. Basically, however, the seal sleeve can be placed in any desired manner on the support element, especially being fastened on it.

The described seal element makes it possible to produce the fluid-tight and electrically conductive connection between the two components in the described manner. Thanks to the spring tongue, a reliable electrical connection is ensured between the components. Thanks to the resilient deflection of the spring tongue and the resulting abrasion against the components, the electrical attachment of the seal element to the two components is furthermore improved.

Another embodiment of the invention proposes that the first contact surface and the second contact surface each lie in a plane and the planes run parallel to each other. This was already pointed out above. The first contact surface, for example, is defined by a first plane and the second contact surface by a second plane. For this purpose, the two contact surfaces are planar or flat in configuration. Now, the two planes are spaced apart from and situated parallel to each other.

One enhancement of the invention proposes that the spring tongues are configured as stamped or punched tongues, and the stamping of the spring tongues occurs in such a way that a stamping burr is present on one free end of the spring tongues facing away from the respective contact surface. It has already been explained that the spring tongues advantageously have a sharp edge, which can be realized by forming the stamping burr. Accordingly, the spring tongues are formed by stamping the support element.

In this case, the stamping is carried out in such a way, and, in particular, the stamping direction is chosen in such a way, that the stamping burr produced by the stamping is formed at the free end of the respective spring tongue and faces away from the respective contact surface. Thus, after the assembly, the stamping burr should be pointing in the direction of the respective component and come into bearing contact with it during the assembly process, so that the sharp stamping burr produces the abrasion that in turn improves the electrical connection between the components.

In the context of one preferred embodiment of the invention, it is proposed that the spring tongues have one region parallel to the contact surfaces and one region angled relative to the contact surfaces. For example, the parallel region adjoins the contact surfaces, while the angled region is spaced apart from the contact surfaces. In particular, the angled region of the spring tongue is thus connected by the respective parallel region to the corresponding contact surface. Thanks to such a configuration, the abrasive action of the spring tongue on the components is improved, while at the same time an adequate spring action is ensured, because the angle between the angled region and the components can be chosen as relatively steep. For example, the parallel region and the angled region subtend an angle which is greater than 0° and less than 180°. Preferably the angle is an obtuse angle, i.e., greater than 90°, so that a free end of the angled region points away from the parallel region.

Another embodiment of the invention proposes that the support element is annular, so that the holding region has a through opening with a closed edge. By the annular configuration of the support element is meant a configuration of such shape that the support element extends continuously in one direction, so that it has a continuous marginal edge. This marginal edge encloses, for example, the through opening, which is accordingly surrounded by the support element. The marginal edge, for example, is present at the end face of the holding region already mentioned above.

The support element, especially the holding region, is configured round, oval or stadium shaped, for example. By the latter is meant a shape which is bounded in cross section by two parallel straight lines as well as two curved lines connecting the two lines at the ends. The curved lines are, for example, partly circular, especially semicircular, and run preferably tangentially to the corresponding straight line on both sides.

One enhancement of the invention may advantageously provide that the first main seal surface and/or the second main seal surface is or are respectively formed at least in regions by at least one sealing lip, which extends in a direction facing away from the respective other main seal surface. The sealing lip serves for improving the sealing action of the seal sleeve. Preferably, one such sealing lip is arranged on each of the main seal surfaces. Preferably, the same number of sealing lips is provided on the two main seal surfaces in each case. For example, each time a plurality of sealing lips are present on the first main seal surface and/or the second main seal surface, thus, especially at least two sealing lips, at least three sealing lips, or at least four sealing lips.

One preferred enhancement of the invention provides that the support element has a pre-seal region, which adjoins the main seal region on the side facing away from the holding region, while the pre-seal region is angled relative to the main seal region, in particular, being situated parallel to the holding region, and wherein on the pre-seal region, a first pre-seal part of the seal sleeve on one side is applied by a first pre-seal surface against the first component to form a seal, and a second pre-seal part of the seal sleeve on the other side is applied by a second pre-seal surface against the second component to form a seal.

In addition to the main seal region, the pre-seal region is accordingly present. The pre-seal region is attached by the main seal region to the holding region of the support element. Preferably, the pre-seal region is formed as a single piece and/or is materially bonded to the main seal region or the holding region. The pre-seal region is angled relative to the main seal region. In this case, the pre-seal region is defined by a plane or lies in a plane that is present at an angle relative to the plane defining the main seal region, an angle that is greater than 0° and less than 180°. Preferably, the angle between the main seal region and the pre-seal region is 60° to 120°, 70° to 110°, 80° to 100° or roughly or exactly equal to 90°. For example, the pre-seal region is arranged parallel to the holding region. Now, the seal sleeve is present not only at the main seal region, but also at the pre-seal region. With respect to the pre-seal regions and the pre-seal surfaces, refer to the remarks for the main seal region and the main seal surfaces, which can be drawn on analogously.

Finally, in the context of one advantageous embodiment of the invention, it may be provided that, when viewed in a sectional cut, the seal sleeve surrounds a free end of the support element facing away from the holding region, so that the seal sleeve forms the first main seal surface and the second main seal surface and/or the first pre-seal surface and the second pre-seal surface. The free end is part of the main seal region or—as long as the pre-seal region is provided—of the pre-seal region. The seal sleeve is now configured such that at least the first main seal surface and the second main seal surface, and optionally the first pre-seal surface and the second pre-seal surface, are formed as a single piece and/or are materially bonded to each other. This realizes an especially good sealing action of the seal element.

The invention furthermore relates to a component assembly, with a first component, a second component, and a seal element for connecting the first component and the second component in a fluid-tight and electrically conductive manner, in particular, with a seal element according to the preceding embodiments.

In this case, it is provided that the seal element has an electrically conductive support element with a holding region and a main seal region which is angled relative to the holding region, wherein the holding region has a first contact surface on one side for contacting the first component, and a second contact surface on the other side for contacting the second component, wherein at least one respective spring tongue that is formed integrally with the support element extends from the first contact surface and the second contact surface in the direction facing away from the respective other contact surface, and wherein, on the main seal region, a first main seal part of an elastic seal sleeve on one side is applied by a first main seal surface against the first component to form a seal, and a second main seal part of the seal sleeve on the other side is applied by a second main seal surface against a second component to form a seal.

The benefits of such a configuration of the component assembly or the seal element have already been pointed out. Both the component assembly and the seal element may be further developed according to the foregoing remarks, so that reference is made to them accordingly.

In the context of another embodiment of the invention, it may be provided that the first component has a receiving opening, in which the second component and the seal element are respectively situated at least in regions, wherein the seal element is held clamped between the first component and the second component. The second component is designed here, for example, as a closure for the receiving opening and accordingly as a cover for the first component. After the assembling of the component assembly, the seal element should be present between the first component and a second component, and, in this case, should be applied against both of them in such a way that, on the one hand, they are electrically connected to each other, and, on the other hand, are sealed against each other.

BRIEF DESCRIPTION OF THE DRAWINGS

The invention shall now be explained more closely with the aid of the exemplary embodiments represented in the drawing, without this being a limitation of the invention. Shown herein are.

DETAILED DESCRIPTION

Figure 1:
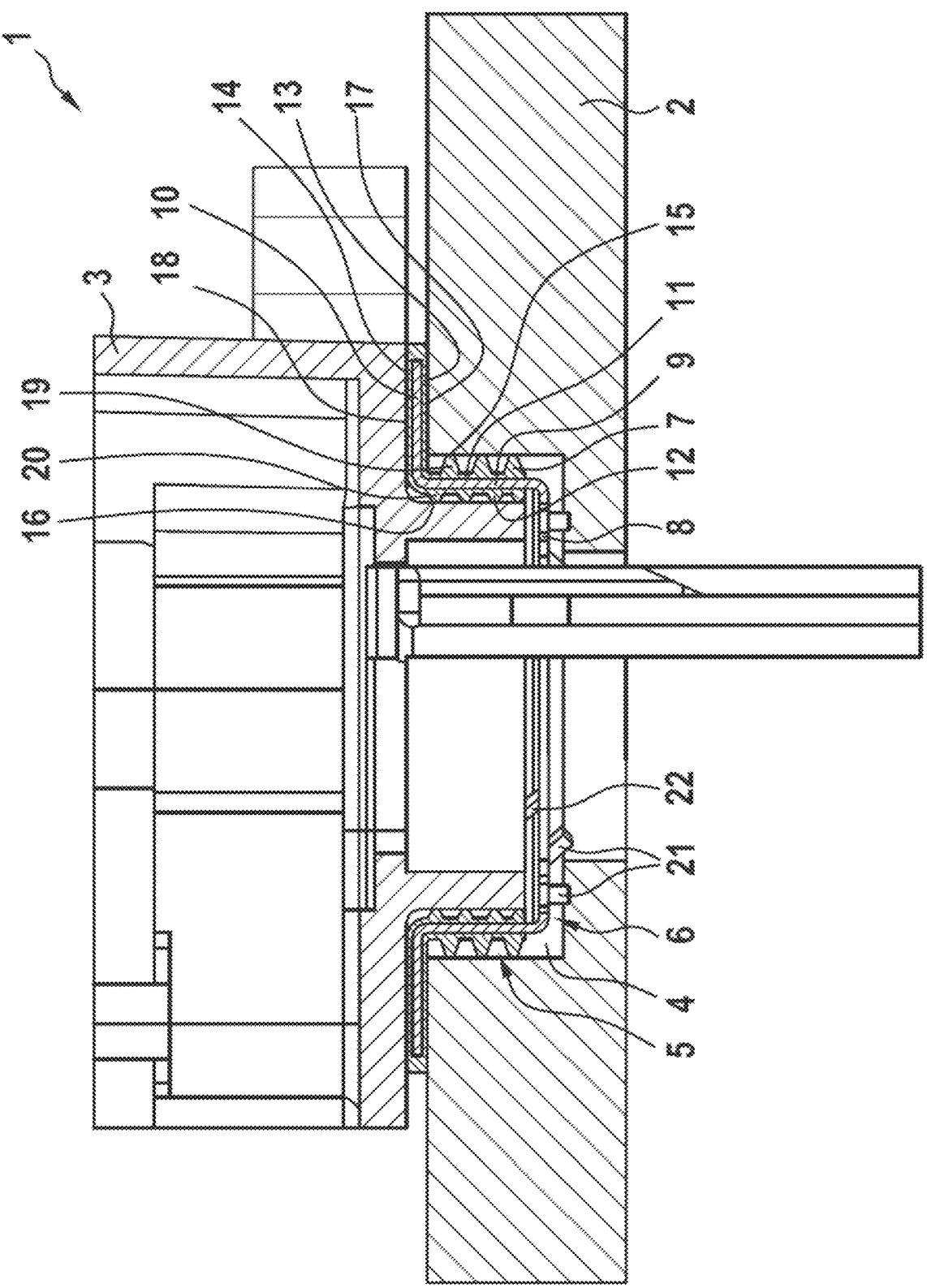
FIG. 1 a schematic sectional representation through a component assembly, having a first component, a second component, and a seal element.

FIG. 1 shows a sectional representation through a region of a component assembly 1, having a first component 2 and a second component 3. The first component 2 comprises a receiving opening 4, with which the second component 3 engages in regions. For the fluid-tight and electrically conducting connection of the two components 2 and 3 to each other, the component assembly 1 has a seal element 5. This comprises a support element 6 made from an electrically conducting material as well as a seal sleeve 7, which surrounds the support element 6 in regions or is fastened on it. The seal sleeve 7 is preferably composed of a flexible sealing material.

The support element 6 in the exemplary embodiment depicted here comprises several regions, namely, a holding region 8, a main seal region 9 and a pre-seal region 10. The main seal region 9 is angled with respect to the holding region 8 and the pre-seal region 10. The holding region 8 and the pre-seal region 10 are preferably arranged such that—as viewed in the section—they are situated parallel to each other, yet extend in opposite directions from the main seal region 9.

The seal sleeve 7 comprises a first main seal part 11, a second main seal part 12, a first pre-seal part 13 and a second pre-seal part 14. The main seal parts 11 and 12 are arranged on opposite sides of the main seal region 9 and the pre-seal parts 13 and 14 are arranged on opposite sides of the pre-seal region 10 of the support element 6. The first main seal part 11 and the first pre-seal part 13 are provided for sealing against the first component 2; the second main seal part 12 and the second pre-seal part 14 are provided for sealing against the second component 3.

The first main seal part 11 is applied by a first main seal surface 15; the second main seal part 12 is applied by a second main seal surface 16; the first pre-seal part 13 is applied by a pre-seal surface 17; and the second pre-seal part 14 is applied by a second pre-seal surface 18 against the respective component 2 or 3. In this case, the main seal surfaces 15 and 16 are formed, at least in regions, by sealing lips 19 and 20 or are present on them, and emerge from the respective main seal part 11 or 12. By its main seal parts 11 and 12 and by its pre-seal parts 13 and 14, the seal sleeve 7 ensures a fluid-tight connection between the components 2 and 3.

The holding region 8 of the support element 6 has spring tongues 21 and 22, whereby the at least one spring tongue 21, preferably multiple spring tongues 21, protrude in the direction of the first component 2, and the at least one spring tongue 22, preferably multiple spring tongues 22, protrude in the direction of the second component 3. The spring tongues 21 and 22 are indicated here merely as an example. The spring tongues 21 and 22 are preferably formed as a single piece and/or are materially bonded with the support element 6. Accordingly, they are likewise composed of the electrically conductive material, so that the electrical connection between the components 2 and 3 is produced by the spring tongues 21 and 22 as well as the support element 6 or its holding region 8.

It will be noticed that the at least one spring tongue 21 is applied against a not otherwise designated base of the receiving opening 4, while the spring tongue 22 engages with a likewise not otherwise designated end face of the second component 3. Preferably, moreover, the pre-seal region 10 together with the pre-seal parts 13 and 14 of the seal sleeve 7 are held clamped between the components 2 and 3, so that a shifting of the seal element 5 is prevented.

Figure 2:
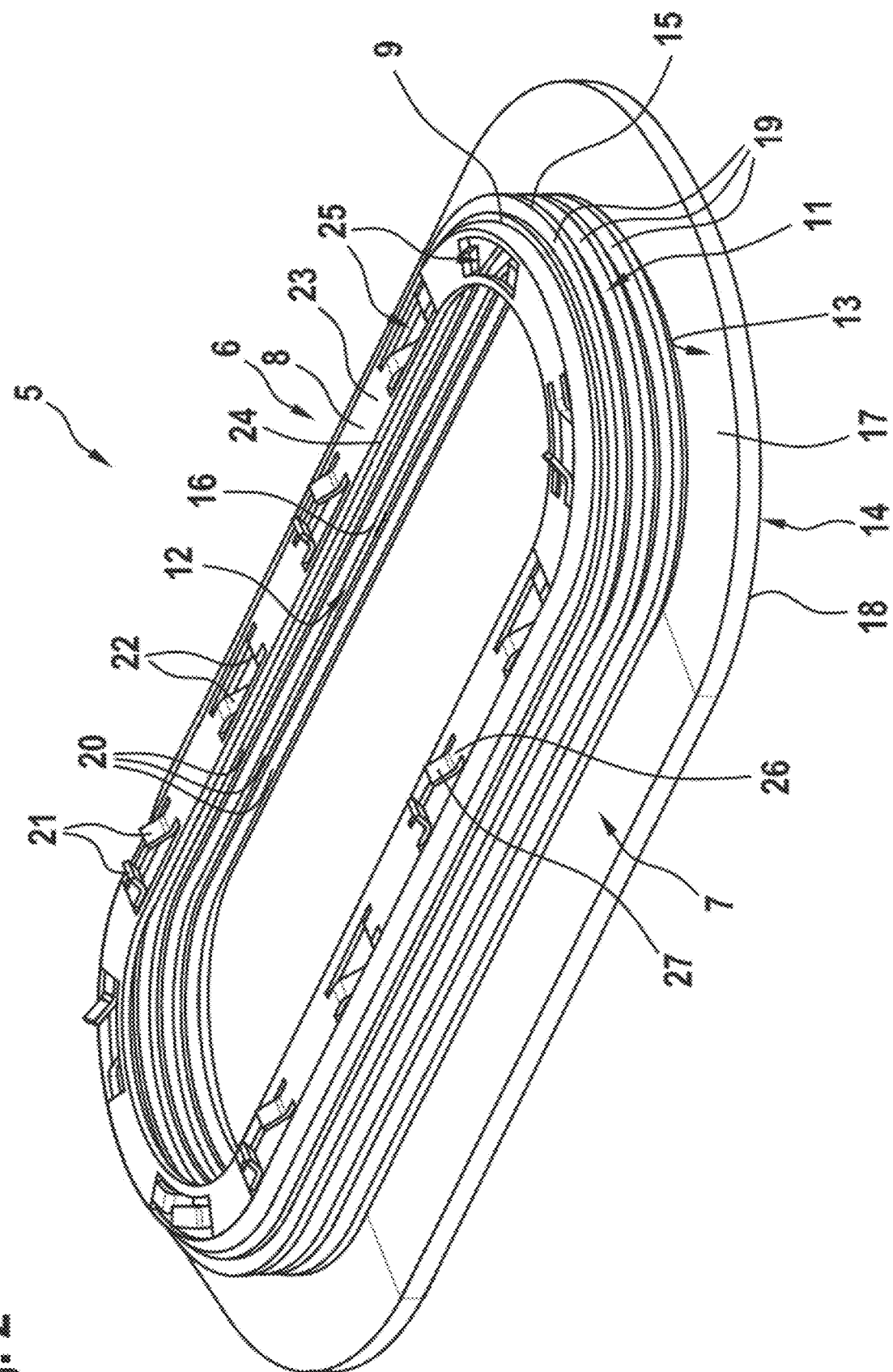
FIG. 2 a schematic detail representation of the seal element, having a support element and a seal sleeve.
Figure 3:
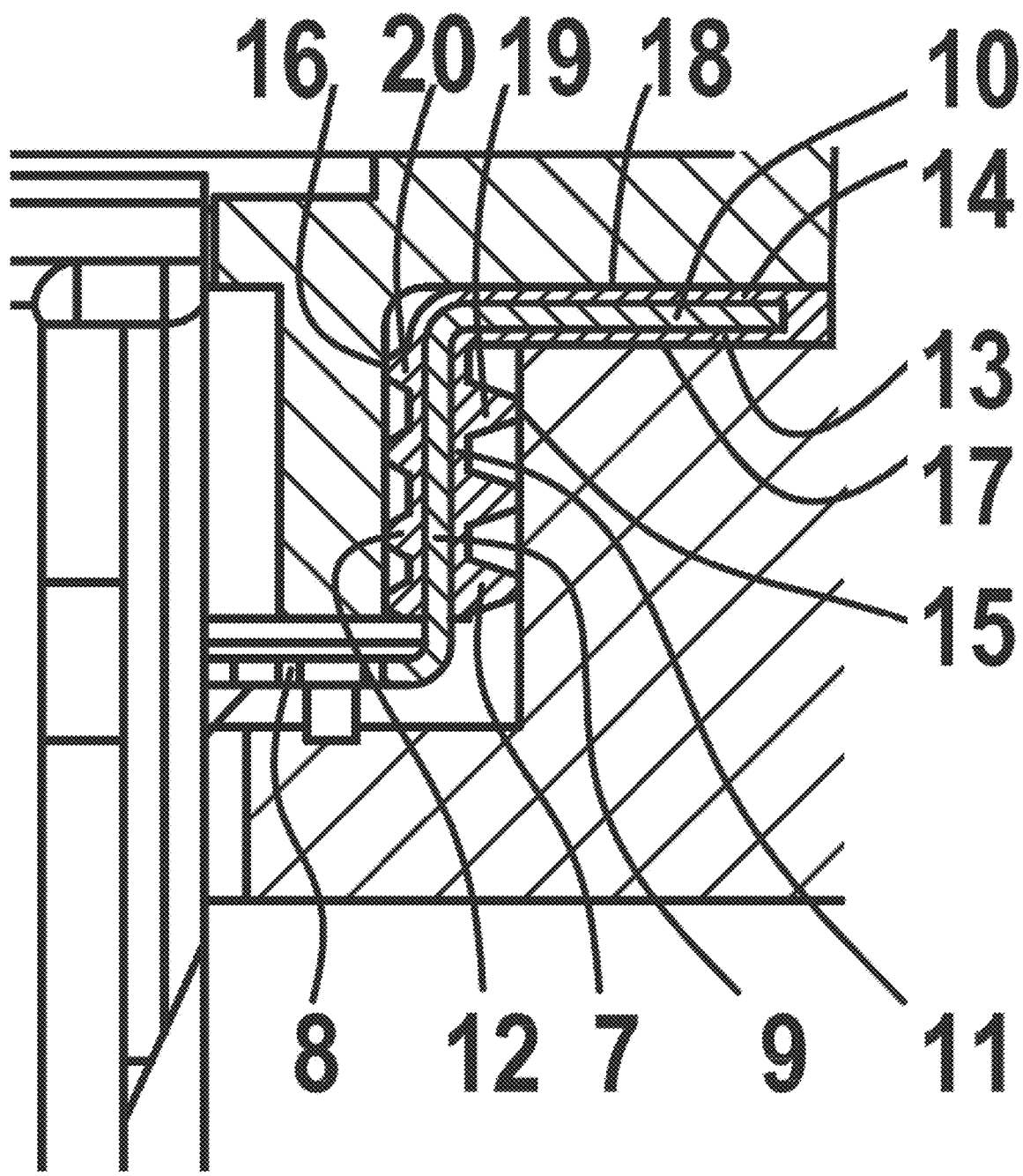
FIG. 3 a schematic sectional representation through a component assembly as in FIG. 1, zoomed in on the seal element.

FIG. 2 shows a detail representation of the seal element 5. Basically, reference is made to the preceding remarks. It will be noticed there that a first contact surface 23 of the holding region 8 and a second contact surface 24 situated opposite it are planar. In the contact surfaces 23 and 24, openings 25 have been made, especially punched openings 25, in which each time two spring tongues 21 and/or 22 are formed. The spring tongues 21 and 22 are present as stamped tongues, which have been produced by stamping or punching. Each of the spring tongues 21 and 22 has a region 26 substantially parallel to the contact surfaces 23 and 24 as well as a region 27 angled with respect to the parallel region 26, and therefore angled with respect to the contact surfaces 23 and 24.

The angled region 27 is joined by the parallel region 26 to the contact surface 23 or 24. It is distinctly noticeable that several of these spring tongues 21 and/or 22 are arranged in each opening 25. Preferably, several spring tongues 21 are arranged in one opening 25, several spring tongues 22 in another of the openings 25, and both a spring tongue 21 and a spring tongue 22 in another one of the openings 25, pointing accordingly in different directions. The openings 25 can be formed in the holding region 8, uniformly distributed in the circumferential direction. But an uneven arrangement is also possible.

With the above-described seal element 5, a reliable and durable, fluid-tight and electrically conducting connection can be realized between the components 2 and 3. Thanks to the configuration of the spring tongues 21 and 22 as stamped tongues, these can furthermore be provided with a stamping burr, which has an abrasive effect on the components 2 and 3 during the assembly process of the component assembly 1. Thanks to this abrasive effect, a coating of the components 2 and 3, especially an oxide layer or the like, can be removed during the assembly process of the component assembly 1, and accordingly, a good electrically conducting connection between the components 2 and 3 can be produced.

The invention claimed is:

1. A seal element for connecting a first component and a second component in a fluid-tight and electrically conductive manner, comprising:
   an electrically conductive support element having a holding region and a main seal region,
   wherein the holding region is provided between parallel-planar end faces of the first component and the second component which are perpendicular to an insertion direction of the second component into the first component,
   wherein the holding region comprises a first contact surface provided between the electrically conductive support element and the first component, and the holding region further comprises a second contact surface provided between the electrically conductive support element and the second component, the first contact surface and the second contact surface lying parallel to each other on opposite sides of the electrically conductive support element,
   wherein each contact surface is associated with at least one spring tongue formed integrally with the electrically conductive support element and extending in a direction towards the respective contact surface,
   wherein the main seal region is provided between sidewalls of the first component and the second component and formed at an angle to the holding region, abutting the holding region,
   wherein, in the main seal region, a first main seal part of an elastic seal sleeve is applied by a first main seal surface to form a seal against the first component and a second main seal part of the elastic seal sleeve is applied by a second main seal surface to form a seal against the second component,
   wherein the first main seal surface and the second main seal surface lie opposite of one another on opposite sides of the electrically conductive support element, wherein the electrically conductive support element has a pre-seal region, which adjoins the main seal region on a side facing away from the holding region, wherein the pre-seal region is angled relative to the main seal region, wherein, on the pre-seal region, a first pre-seal part of the elastic seal sleeve is applied by a first pre-seal surface against the first component to form a seal, and a second pre-seal part of the elastic seal sleeve is applied by a second pre-seal surface against the second component to form a seal, and wherein the first pre-seal surface and the second pre-seal surface lie opposite of one another on opposite sides of the electrically conductive support element.

2. The seal element as claimed in claim 1, wherein the spring tongues are configured as stamped tongues, and the stamping or punching of the spring tongues occurs in such a way that a stamping burr is present on a free end of the spring tongues facing away from the respective contact surface.

3. The seal element as claimed in claim 1, wherein the spring tongues have one region parallel to the contact surfaces and one region angled relative to the contact surfaces.

4. The seal element as claimed in claim 1, wherein the electrically conductive support element is annular, so that the holding region comprises a through opening with a closed marginal edge.

5. The seal element as claimed in claim 1, wherein the first main seal surface and/or the second main seal surface are respectively formed, at least in regions, by at least one sealing lip, which extends in a direction facing away from the respective other main seal surface.

6. The seal element as claimed in claim 1, wherein the elastic seal sleeve, when viewed in a sectional cut, encloses a free end of the electrically conductive support element facing away from the holding region to connect the first pre-seal part with the second pre-seal part, so that the elastic seal sleeve forms the first main seal surface and the second main seal surface and/or the first pre-seal surface and the second pre-seal surface.

7. A component assembly, comprising:

a first component, a second component, and a seal element for connecting the first component and the second component in a fluid-tight and electrically conductive manner, the seal element comprising an electrically conductive support element having a holding region and a main seal region, wherein the holding region is provided between parallel-planar end faces of the first component and the second component, wherein the holding region comprises a first contact surface provided between the electrically conductive support element and the first component, and the holding region further comprises a second contact surface provided between the electrically conductive support element and the second component, the first contact surface and the second contact surface lying parallel to each other on opposite sides of the electrically conductive support element, wherein each contact surface is associated with at least one spring tongue formed integrally with the electrically conductive support element and extending in a direction towards the respective contact surface, wherein the main seal region is provided between sidewalls of the first component and the second component and formed at an angle to the holding region, abutting the holding region, wherein, in the main seal region, a first main seal part of an elastic seal sleeve is applied by a first main seal surface of the electrically conductive support element to form a seal against the first component and a second main seal part of the elastic seal sleeve is applied by a second main seal surface of the electrically conductive support element to form a seal against the second component, wherein the first main seal surface and the second main seal surface lie opposite of one another on opposite sides of the electrically conductive support element, wherein the electrically conductive support element has a pre-seal region, which adjoins the main seal region on a side facing away from the holding region, wherein the pre-seal region is angled relative to the main seal region, wherein, on the pre-seal region, a first pre-seal part of the elastic seal sleeve is applied by a first pre-seal surface against the first component to form a seal, and a second pre-seal part of the elastic seal sleeve is applied by a second pre-seal surface against the second component to form a seal, and wherein the first pre-seal surface and the second pre-seal surface lie opposite of one another on opposite sides of the electrically conductive support element.

8. The component assembly as claimed in claim 7, wherein the first component has a receiving opening, in which the second component and the seal element are respectively situated, at least in regions, wherein the seal element is held clamped between the first component and the second component.

* * * * *